(12) United States Patent
Tanaka

(10) Patent No.: US 10,026,761 B2
(45) Date of Patent: Jul. 17, 2018

(54) SEMICONDUCTOR DEVICE AND METHOD OF MANUFACTURING THE SAME, SEMICONDUCTOR MODULE, AND ELECTRONIC DEVICE

(71) Applicant: SONY CORPORATION, Tokyo (JP)

(72) Inventor: Kiyohisa Tanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/524,070

(22) PCT Filed: Oct. 29, 2015

(86) PCT No.: PCT/JP2015/080482
§ 371 (c)(1),
(2) Date: May 3, 2017

(87) PCT Pub. No.: WO2016/076124
PCT Pub. Date: May 19, 2016

(65) Prior Publication Data
US 2017/0323915 A1    Nov. 9, 2017

(30) Foreign Application Priority Data

Nov. 11, 2014  (JP) ................................. 2014-228895

(51) Int. Cl.
*H01L 31/0232* (2014.01)
*H01L 27/146* (2006.01)
(Continued)

(52) U.S. Cl.
CPC .. *H01L 27/14607* (2013.01); *H01L 27/14625* (2013.01); *H01L 27/14687* (2013.01); *H04N 1/028* (2013.01); *H04N 3/155* (2013.01)

(58) Field of Classification Search
USPC ..... 257/99, E33.059, E21.503, 40, 642–643, 257/759, E51.001–E51.052,
(Continued)

(56) References Cited

U.S. PATENT DOCUMENTS

2005/0270405 A1* 12/2005 Tanida .............. H01L 27/14618
348/340
2015/0029369 A1* 1/2015 Nagata ................. H04N 5/2257
348/294
2016/0099285 A1* 4/2016 Kumagai .......... H01L 27/14607
29/25.01

FOREIGN PATENT DOCUMENTS

JP          1-202989 A       8/1989
JP       2001-156278 A       6/2001
(Continued)

OTHER PUBLICATIONS

International Search Report and Written Opinion of PCT Application No. PCT/JP2015/080482, dated Dec. 8, 2015, 08 pages of English Translation and 08 pages of ISRWO.

(Continued)

*Primary Examiner* — Tram H Nguyen
(74) *Attorney, Agent, or Firm* — Chip Law Group

(57) ABSTRACT

The present technology relates to a semiconductor device and a method of manufacturing the same, a semiconductor module, and an electronic device capable of more certainly improving an optical characteristic and chromatic aberration. A semiconductor package provided with a pedestal having a cylindrical shape including a curved surface curved so as to be concave to a light incident side, and a linear image sensor on which a plurality of pixels each including a photoelectric conversion element is arranged in a one-dimensional direction, the linear image sensor fixed on the curved surface on which a light-receiving area formed of a plurality of pixels is curved so as to be concave to the light
(Continued)

incident side is provided. The present technology may be applied to the semiconductor package used in an image reading device, for example.

9 Claims, 13 Drawing Sheets

(51) Int. Cl.
*H04N 3/14* (2006.01)
*H04N 1/028* (2006.01)

(58) Field of Classification Search
USPC ... 257/E25.008–E25.009, 88, 219, 239, 240, 257/241, 246, E27.082–E27.083, 257/E27.15–E21.163; 438/29, 69, 82, 99, 438/28, 60, 75, 144
See application file for complete search history.

(56) References Cited

FOREIGN PATENT DOCUMENTS

| | | |
|---|---|---|
| JP | 2005-094701 A | 4/2005 |
| JP | 2005-191218 A | 7/2005 |

OTHER PUBLICATIONS

International Preliminary Report on Patentability of PCT Application No. PCT/JP2015/080482, dated May 26, 2017, 09 pages of English Translation and 05 pages of IPRP.

\* cited by examiner

SEMICONDUCTOR DEVICE AND METHOD OF MANUFACTURING THE SAME, SEMICONDUCTOR MODULE, AND ELECTRONIC DEVICE

CROSS REFERENCE TO RELATED APPLICATIONS

This application is a U.S. National Phase of International Patent Application No. PCT/JP2015/080482 filed on Oct. 29, 2015, which claims priority benefit of Japanese Patent Application No. JP 2014-228895 filed in the Japan Patent Office on Nov. 11, 2014. Each of the above-referenced applications is hereby incorporated herein by reference in its entirety.

TECHNICAL FIELD

The present technology relates to a semiconductor device and a method of manufacturing the same, a semiconductor module, and an electronic device, and especially relates to the semiconductor device and the method of manufacturing the same, the semiconductor module, and the electronic device capable of more certainly improving an optical characteristic and chromatic aberration.

BACKGROUND ART

An image reading device such as a copying machine and an image scanner is widely used. In this type of image reading device, problems of deterioration in modulation transfer function (MTF), occurrence of shading, and color shift due to chromatic aberration in a central area and areas on both ends of a read image are known.

As a countermeasure, there is a method of improving an optical system such as a lens; however, a lens configuration becomes complicated and a cost increases due to an increase in the number of lenses, usage of an expensive lens and the like. Therefore, a method of not improving the optical system such as the lens but curving an image sensor side such as a linear image sensor and a semiconductor package is suggested (for example, refer to Patent Document 1).

CITATION LIST

Patent Document

Patent Document 1: Japanese Patent Application Laid-Open No. 2005-94701

SUMMARY OF THE INVENTION

Problems to be Solved by the Invention

However, in the technology disclosed in Patent Document 1, a joint body forming the semiconductor package is curved, so that a curvature thereof cannot be made uniform and stable, and as a result, the optical characteristic such as the MTF and the chromatic aberration cannot be improved.

The present technology is achieved in view of such a condition, and an object thereof is to more certainly improve the optical characteristic and the chromatic aberration in a case where the image sensor side is curved.

Solutions to Problems

A semiconductor device according to a first aspect of the present technology is a semiconductor device provided with a pedestal having a cylindrical shape including a curved surface curved so as to be concave to a light incident side, and a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

In the semiconductor device according to the first aspect of the present technology, the pedestal has the cylindrical shape including the curved surface curved so as to be concave to the light incident side, and the linear image sensor on which a plurality of pixels each including the photoelectric conversion element is arranged in a one-dimensional direction is fixed on the curved surface, the linear image sensor on which the light-receiving area formed of the plurality of pixels is curved so as to be concave to the light incident side.

A method of manufacturing according to a second aspect of the present technology is a method of manufacturing a semiconductor device including a process of cutting out a wafer in a strip shape on which a plurality of linear image sensors on which a plurality of pixels each including a photoelectric conversion element is arranged in a one-dimensional direction is formed from a wafer on which a circuit is formed, a process of fixing the wafer in the strip shape on a pedestal having a cylindrical shape including a curved surface curved so as to be concave to a light incident side, and a process of cutting out the pedestal on which the wafer in the strip shape is fixed for each linear image sensor to make a chip.

In the method of manufacturing according to the second aspect of the present technology, the wafer in the strip shape on which a plurality of linear image sensors on which a plurality of pixels each including the photoelectric conversion element is arranged in a one-dimensional direction is formed is cut out from the wafer on which the circuit is formed, the wafer in the strip shape is fixed on the pedestal having the cylindrical shape including the curved surface curved so as to be concave to the light incident side, and the pedestal on which the wafer in the strip shape is fixed is cut for each linear image sensor to make a chip.

A semiconductor module according to a third aspect of the present technology is a semiconductor module provided with a semiconductor device, an optical lens system, and a signal processing unit, in which the semiconductor device includes a pedestal having a cylindrical shape including a curved surface curved so as to be concave to a light incident side, and a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

The semiconductor module according to the third aspect of the present technology is provided with the semiconductor device, the optical lens system, and the signal processing unit, and in the semiconductor device, the pedestal has the cylindrical shape including the curved surface curved so as to be concave to the light incident side, and the linear image sensor on which a plurality of pixels each including the photoelectric conversion element is arranged in a one-dimensional direction is fixed on the curved surface, the linear image sensor on which the light-receiving area formed of the plurality of pixels is curved so as to be concave to the light incident side.

An electronic device according to a fourth aspect of the present technology is an electronic device provided with a semiconductor device including a pedestal having a cylindrical shape including a curved surface curved so as to be concave to a light incident side, and a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

The electronic device according to the fourth aspect of the present technology is provided with the semiconductor device in which the pedestal has the cylindrical shape including the curved surface curved so as to be concave to the light incident side, and the linear image sensor on which a plurality of pixels each including the photoelectric conversion element is arranged in a one-dimensional direction is fixed on the curved surface, the linear image sensor on which the light-receiving area formed of the plurality of pixels is curved so as to be concave to the light incident side.

Effects of the Invention

According to the first to fourth aspects of the present technology, it is possible to improve the optical characteristic and the chromatic aberration.

Meanwhile, the effects are not necessarily limited to those herein described, and may include any of the effects described in the present disclosure.

MODE FOR CARRYING OUT THE INVENTION

An embodiment of the present technology is hereinafter described with reference to the drawings. Meanwhile, the description will be given in the following order.
1. Structure of Semiconductor Package
2. Flow of Process of Manufacturing Semiconductor Package
3. Configuration of Semiconductor Module
4. Configuration of Image Reading Device
<1. Structure of Semiconductor Package>
(External Appearance Configuration of Semiconductor Package)

Figure 1:
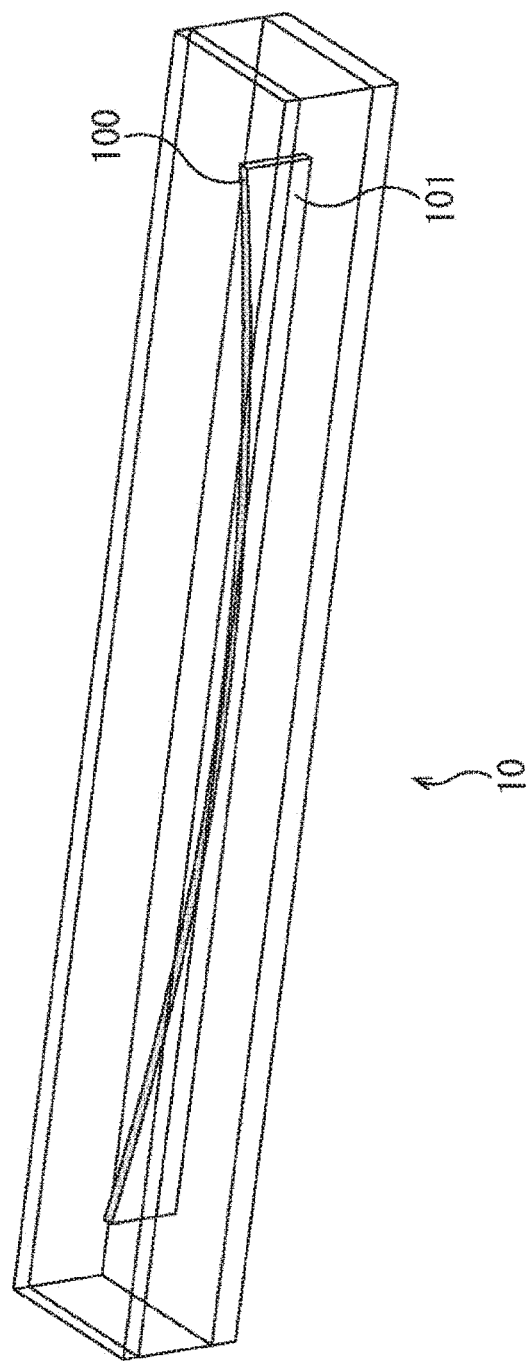
FIG. 1 is a perspective view illustrating a configuration of an external appearance of a semiconductor package to which the present technology is applied.

FIG. 1 is a perspective view illustrating a configuration of an external appearance of a semiconductor package to which the present technology is applied.

A semiconductor package 10 is a semiconductor device incorporated in an image reading device such as a copying machine, an image scanner, a bar code reader, and a multi-function printer, for example, which outputs one-dimensional image information as a time-series electrical signal. In FIG. 1, the semiconductor package 10 includes a linear image sensor 100 and a curved pedestal 101.

The linear image sensor 100 is an image sensor such as a complementary metal oxide semiconductor (CMOS) image sensor and a charge coupled device (CCD) in which a plurality of pixels each including a photoelectric conversion element (photodiode) is arranged in a one-dimensional direction. The linear image sensor 100 also includes a peripheral circuit which drives the pixels and performs analog/digital (A/D) conversion.

The linear image sensor 100 captures incident light from an object through an optical lens system (not illustrated) and converts an amount of light incident on a light-receiving area to electrical signals pixel by pixel, thereby outputting the one-dimensional image information as the time-series electrical signal.

The curved pedestal 101 has a cylindrical shape including a curved surface curved so as to be concave to a light incident side. The linear image sensor 100 is fixed (mounted) on the curved surface of the curved pedestal 101, so that the light-receiving area formed of a plurality of pixels is curved so as to be concave to the light incident side. With this arrangement, respective pixels on the light-receiving area formed of a plurality of pixels are at the same distance from a center of a lens of an optical lens system which allows the light from the object to be incident on the light-receiving area.

Meanwhile, the curved pedestal 101 is formed of a ceramic material, a mold material or the like, for example. Also, the linear image sensor 100 is fixed (mounted) so as to cover an entire curved surface of the curved pedestal 101 or a large part thereof.

The semiconductor package 10 is configured in the above-described manner. Meanwhile, in the semiconductor package 10 in FIG. 1, wiring and the like is not illustrated for simplifying the description. The linear image sensor 100 is sometimes also referred to as a line sensor, a one-dimensional sensor and the like in addition to the linear image sensor.

(Cross-Sectional Structure of Semiconductor Package)

Figure 2:
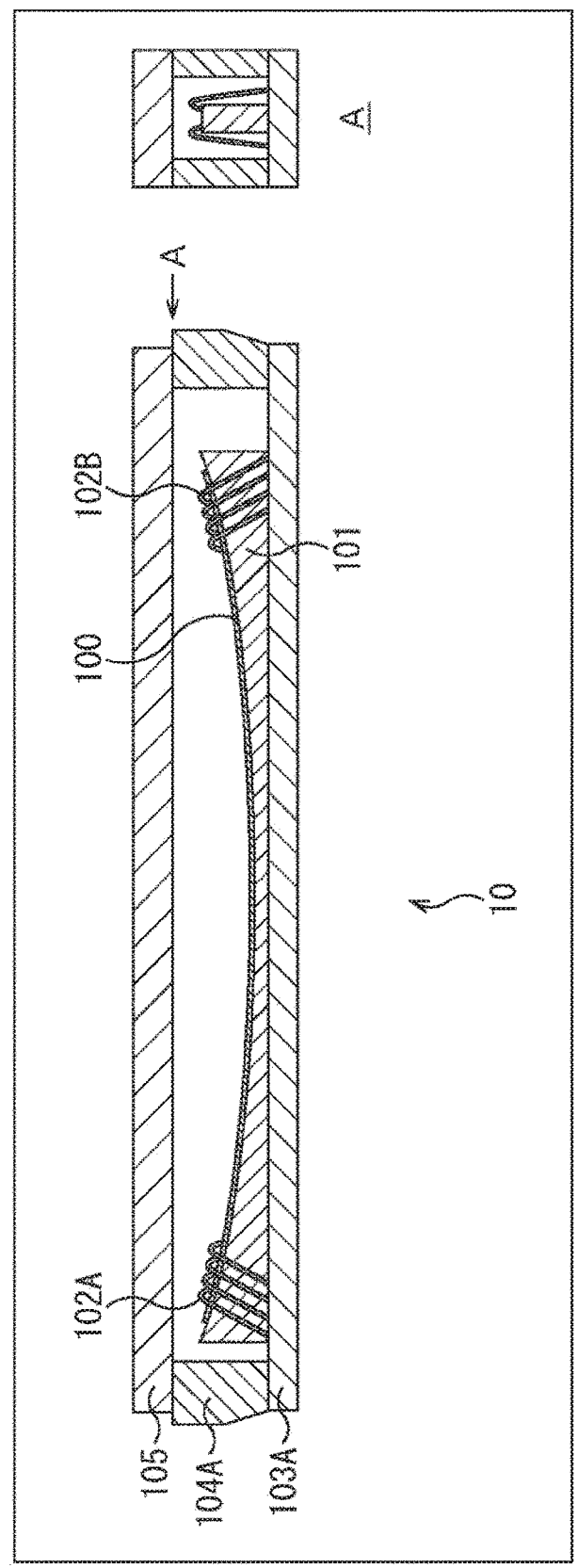
FIG. 2 is a cross-sectional view illustrating a cross-section of the semiconductor package to which the present technology is applied.

FIG. 2 is a cross-sectional view illustrating a cross-section of the semiconductor package 10 in FIG. 1. Meanwhile, FIG. 2 illustrates a side view in a case where the cross-section of the semiconductor package 10 is seen in a direction of arrow A.

In FIG. 2, the linear image sensor 100 thickness of which is thinned is fixed on the curved pedestal 101; this is curved so as to be concave to the light incident side according to the shape of the curved pedestal 101. The curved pedestal 101 is fixed on a planar substrate 103A. Also, glass 105 is fixed by means of a frame portion 104A on the planar substrate 103A. The planar substrate 103A also includes a wiring layer and (a pad portion of) the linear image sensor 100 is electrically connected to (a lead portion of) the planar substrate 103A through wires 102A and 102B.

Figure 3:
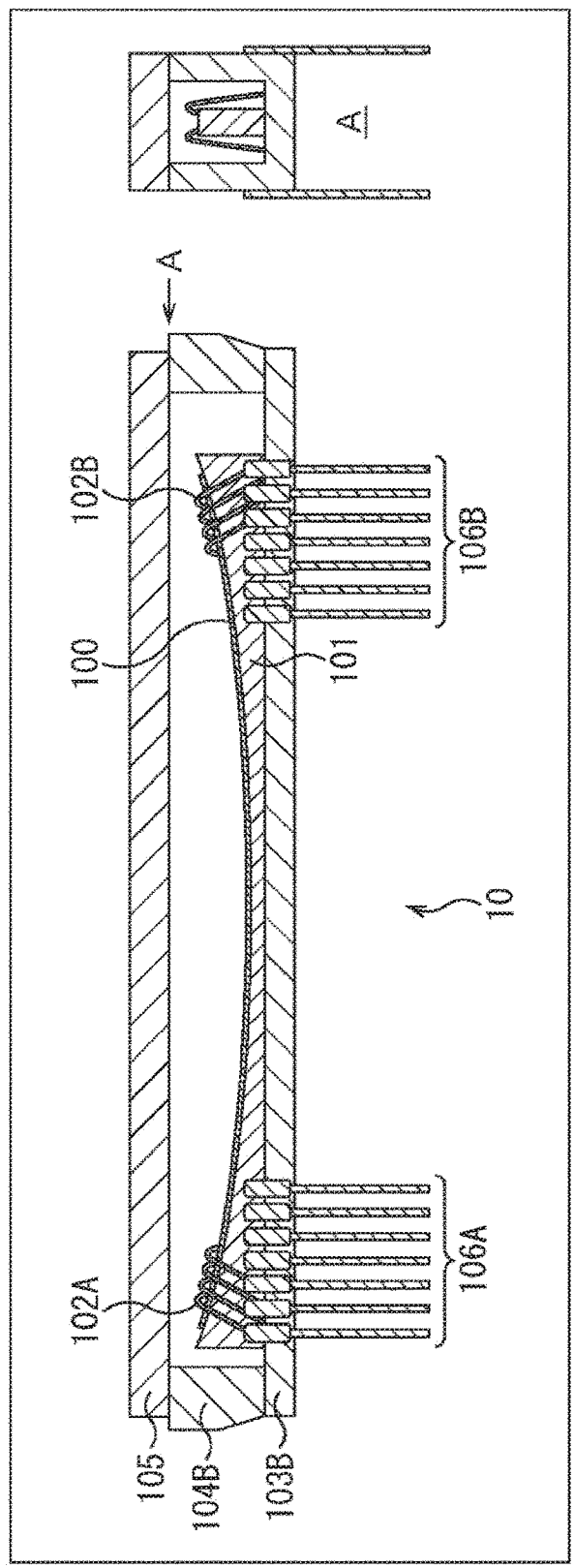
FIG. 3 is a cross-sectional view illustrating a cross-section of the semiconductor package to which the present technology is applied.

Meanwhile, although a structure including the planar substrate 103A formed of an organic material, the ceramic material or the like and the frame portion 104A formed of the mold material and the like is illustrated in the structure in FIG. 2, another structure may also be adopted. For example, as illustrated in FIG. 3, a planar substrate 103B and a frame portion 104B formed of the same material such as the ceramic material may be configured integrally. Also, in a structure in FIG. 3, terminals 106A and 106B which electrically connect the semiconductor package 10 to outside are provided on a side surface of the semiconductor package 10. Meanwhile, in the following description, in a case where it is not especially required to distinguish the planar substrates 103A and 103B from each other, they are simply referred to as the substrate 103.

(Light Incident on Light-Receiving Area)

Figure 4:
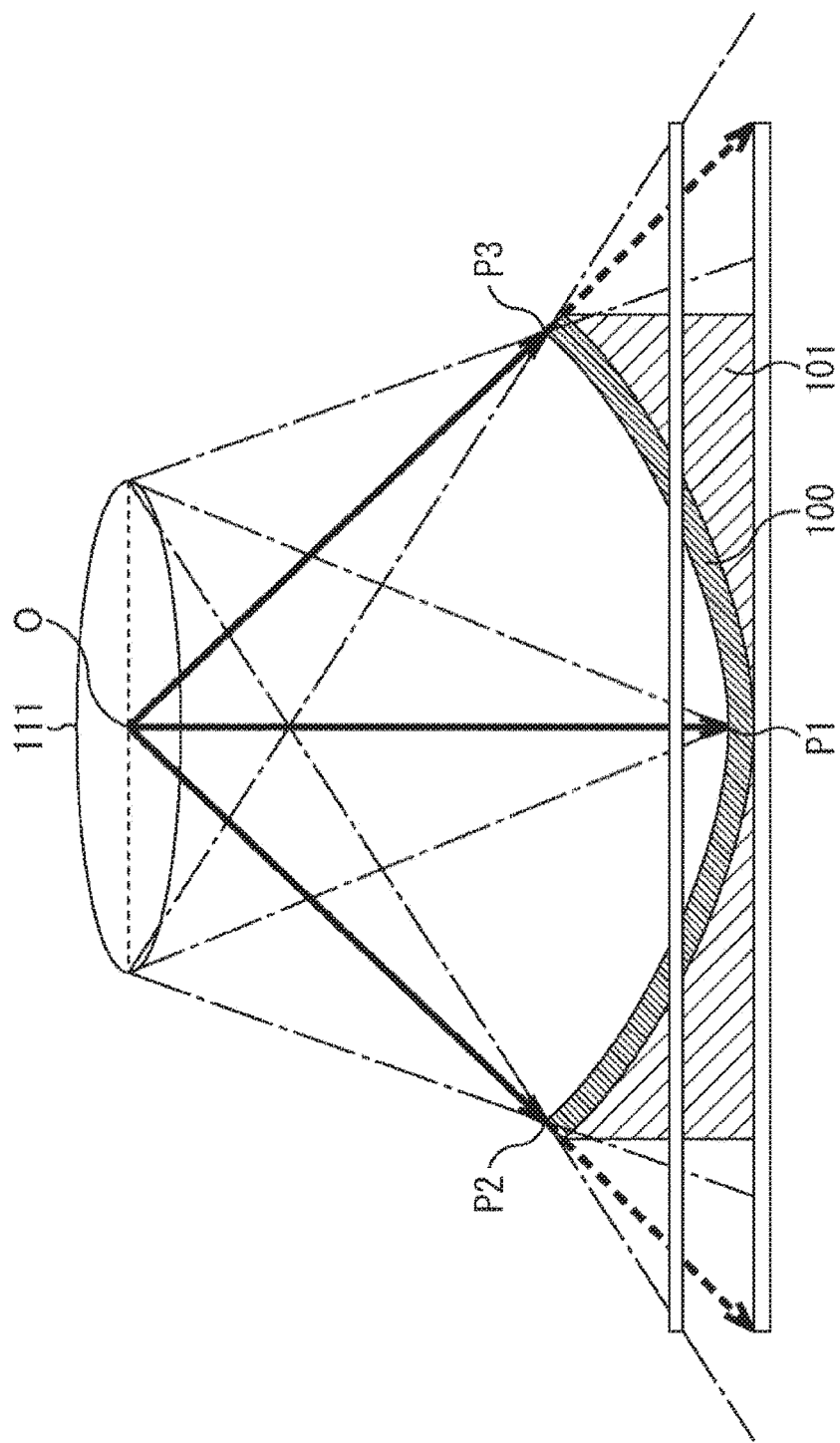
FIG. 4 is a view schematically illustrating light incident on a light-receiving area in a linear image sensor fixed on a curved pedestal.

FIG. 4 is a view schematically illustrating the light incident on the light-receiving area in the linear image sensor 100 fixed on the curved pedestal 101.

In FIG. 4, a lens 111 allows the light from the object to be incident on the light-receiving area in the linear image sensor 100. Herein, in the light-receiving area in the linear image sensor 100, when focusing on a pixel P1 located on a center thereof and pixels P2 and P3 located on ends thereof, distances between the pixels and a center O of the lens 111 are constant as indicated by bold arrows in the drawing. Specifically, a distance OP1 between the center O of the lens 111 and the pixel P1, a distance OP2 between the center O of the lens 111 and the pixel P2, and a distance OP3 between the center O of the lens 111 and the pixel P3 are the same.

That is to say, the linear image sensor 100 is fixed on the curved pedestal 101 to be curved according to a curvature of the curved surface, so that the distances from the respective pixels on the light-receiving area to the center O of the lens 111 are constant. Meanwhile, in a case where the light-receiving area is not curved, the surface is flat, so that the distances from the respective pixels on the light-receiving area to the center of the lens 111 are not the same in this case.

As described above, in the semiconductor package 10, since the distances from the respective pixels on the light-receiving area in the linear image sensor 100 to the center O of the lens 111 are constant, an optical characteristic such as MTF and chromatic aberration may be improved, so that it is possible to solve problems of deterioration in MTF, occurrence of shading, and color shift due to the chromatic aberration. Also, at that time, the linear image sensor 100 is fixed on the curved pedestal 101 including the curved surface for curving the light-receiving area thereof, so that a uniform and stable curvature may be realized in (the light-receiving area of) the curved linear image sensor 100.

Furthermore, in the semiconductor package 10, the above-described problems of the deterioration in MTF and the like may be solved by curving the image sensor 100 side, so that it is possible to inhibit an increase in cost due to an increase in the number of lenses and usage of an expensive lens without a complex lens configuration due to improvement in optical system such as the lens. Especially, the linear image sensor 100 is longer in the one-dimensional direction than an area image sensor in which a plurality of pixels is arranged in a two-dimensional manner, so that it is not possible to focus on the central pixel and the pixels on the ends because of the characteristic thereof; however, in the semiconductor package 10, since the light-receiving area of the linear image sensor 100 is curved by the curved pedestal 101, it is possible to focus on the central pixel and the pixels on the ends, so that it is possible to improve the optical characteristic such as the MTF and the chromatic aberration without using a special lens such as an aspherical lens (without improvement in optical system such as the lens).

Meanwhile, in a case where the optical system such as the lens is improved, there might be a case where a high-brightness light source should be prepared and a case where a light source customized by light distribution adjustment should be prepared due to a decrease in light amount; however, it is not required to improve the optical system when the structure of the semiconductor package 10 described above is adopted, so that a lower cost may be realized also in such a point.

Also, in the semiconductor package 10, when the linear image sensor 100 is fixed on the curved surface of the curved pedestal 101, the shape thereof is not changed by force or another member is not used for maintaining the shape thereof, for example, so that a compact package may be realized at a low cost, and it is possible to cope with environmental change due to temperature change during usage. Also, in the semiconductor package 10, when the linear image sensor 100 is fixed (mounted) on the curved surface of the curved pedestal 101, an optical path length may be made shorter, so that an optical member such as a mirror may be omitted.

<2. Flow of Process of Manufacturing Semiconductor Package>

(Process of Manufacturing Semiconductor Package)

Figure 5:
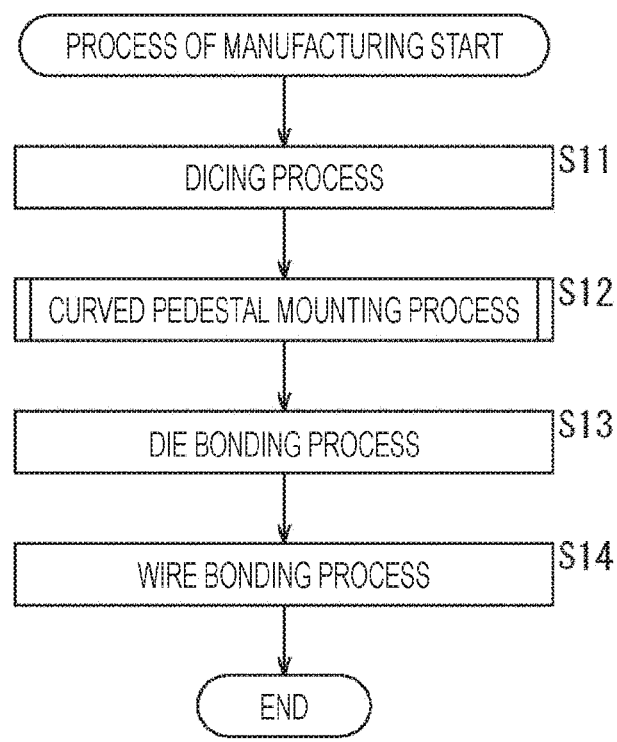
FIG. 5 is a view illustrating a flow of a process of manufacturing the semiconductor package to which the present technology is applied.

Next, a flow of a process of manufacturing the semiconductor package 10 is described. FIG. 5 is a flowchart illustrating the flow of the process of manufacturing the semiconductor package 10. Meanwhile, the process of manufacturing in FIG. 5 corresponds to a post process to enclose a semiconductor chip obtained from a wafer on which a circuit is formed in a preceding process (wafer process) in a package.

Figure 6:
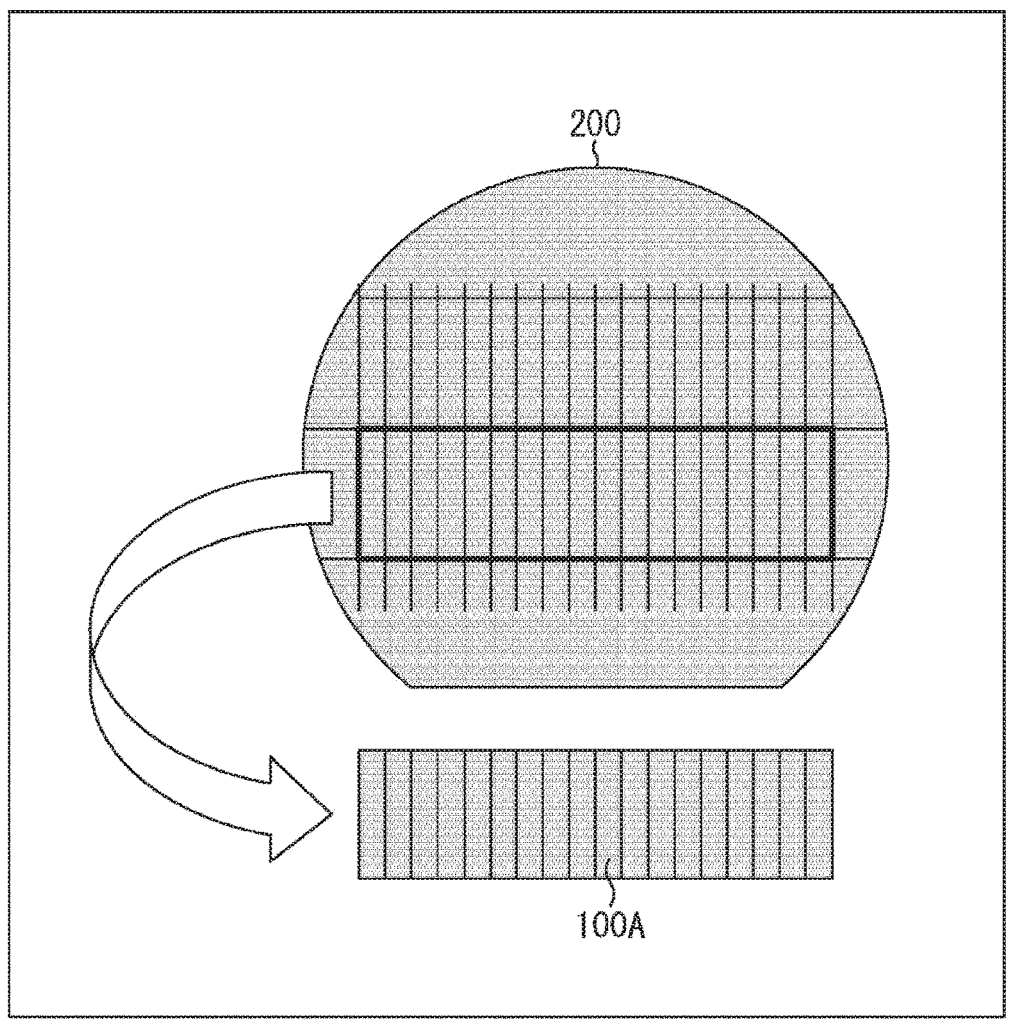
FIG. 6 is a view schematically illustrating a dicing process.

A dicing process is performed at step S11. In the dicing process, as illustrated in FIG. 6, a wafer 200 on which the circuit is formed is diced along a scribe line in a lateral direction, so that a wafer 100A in a strip shape on which a plurality of semiconductor chips (linear image sensors 100) is formed enclosed by a bold frame in the drawing is cut out.

At step S12, a curved pedestal mounting process is performed. In the curved pedestal mounting process, a process of fixing (mounting) the wafer 100A in the strip shape cut out in the process at step S11 on the curved pedestal 101A and thereafter cutting the curved pedestal 101A on which the wafer 100A in the strip shape is fixed for each semiconductor chip (linear image sensor 100) to make a chip is performed. Meanwhile, the curved pedestal 101A has a shape obtained by elongating the curved pedestal 101 having the cylindrical shape in a width direction. Also, the curved pedestal mounting process will be described later in detail with reference to a flowchart in FIG. 8.

At step S13, a die bonding process is performed. In the die bonding process, the curved pedestal 101 on which the linear image sensor 100 which is made a chip in the process at step S12 is fixed (mounted) is mounted on the substrate 103 to be fixed thereon.

At step S14, a wire bonding process is performed. In the wire bonding process, wire bonding is performed by connecting the pad portion of the linear image sensor 100 on the curved surface of the curved pedestal 101 fixed on the substrate 103 in the process at step S13 to the lead portion of the substrate 103 by means of the wire 102. With this arrangement, the linear image sensor 100 is electrically connected to the substrate 103.

Figure 7:
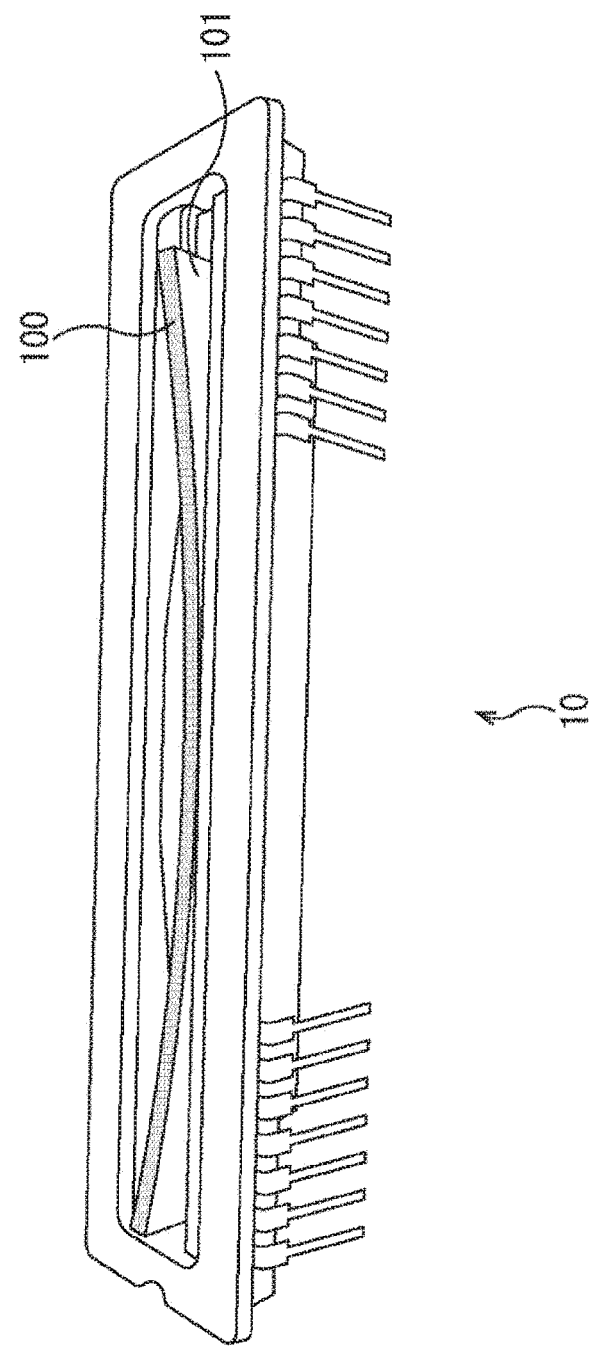
FIG. 7 is a view schematically illustrating the semiconductor package.

In this manner, the post process performed after the preceding process is completed and the semiconductor package 10 in FIG. 7 is manufactured.

The flow of the process of manufacturing the semiconductor package 10 is described above. In the process of manufacturing, the dicing process (S11) to cut out the wafer 100A in the strip shape is performed and the curved pedestal mounting process (S12) to mount the linear image sensor 100 formed on the wafer 100A in the strip shape on the curved pedestal 101 is performed. Then, the die bonding process (S13) to fix the curved pedestal 101 on which the linear image sensor 100 is fixed (mounted) on the substrate 103 is performed and the wire bonding process (S14) to electrically connect the linear image sensor 100 to the substrate 103 by the wire 102 is performed, and accordingly, the semiconductor package 10 is manufactured.

In this manner, in the method of manufacturing in FIG. 5, it is possible to manufacture the semiconductor package 10 only by adding the curved pedestal mounting process to the generally performed processes such as the dicing process, the die bonding process, and the wire bonding process, so that it is possible to manufacture the semiconductor package 10 at a low cost by using existing equipment.

(Curved Pedestal Mounting Process)

Figure 8:
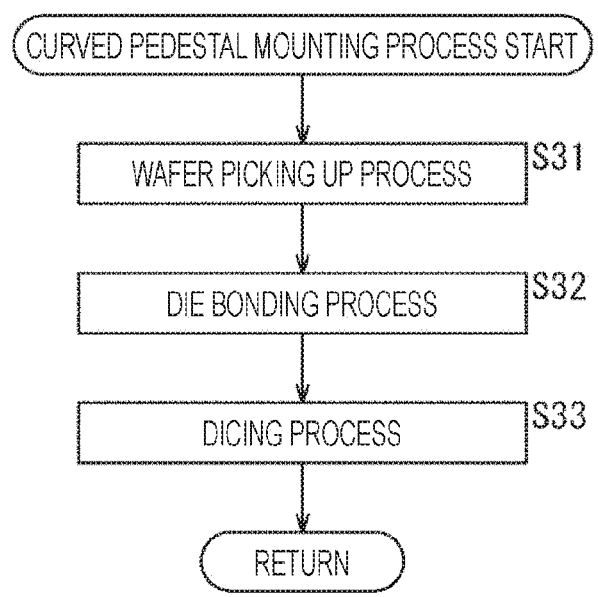
FIG. 8 is a view illustrating a flow of a curved pedestal mounting process.
Figure 9:
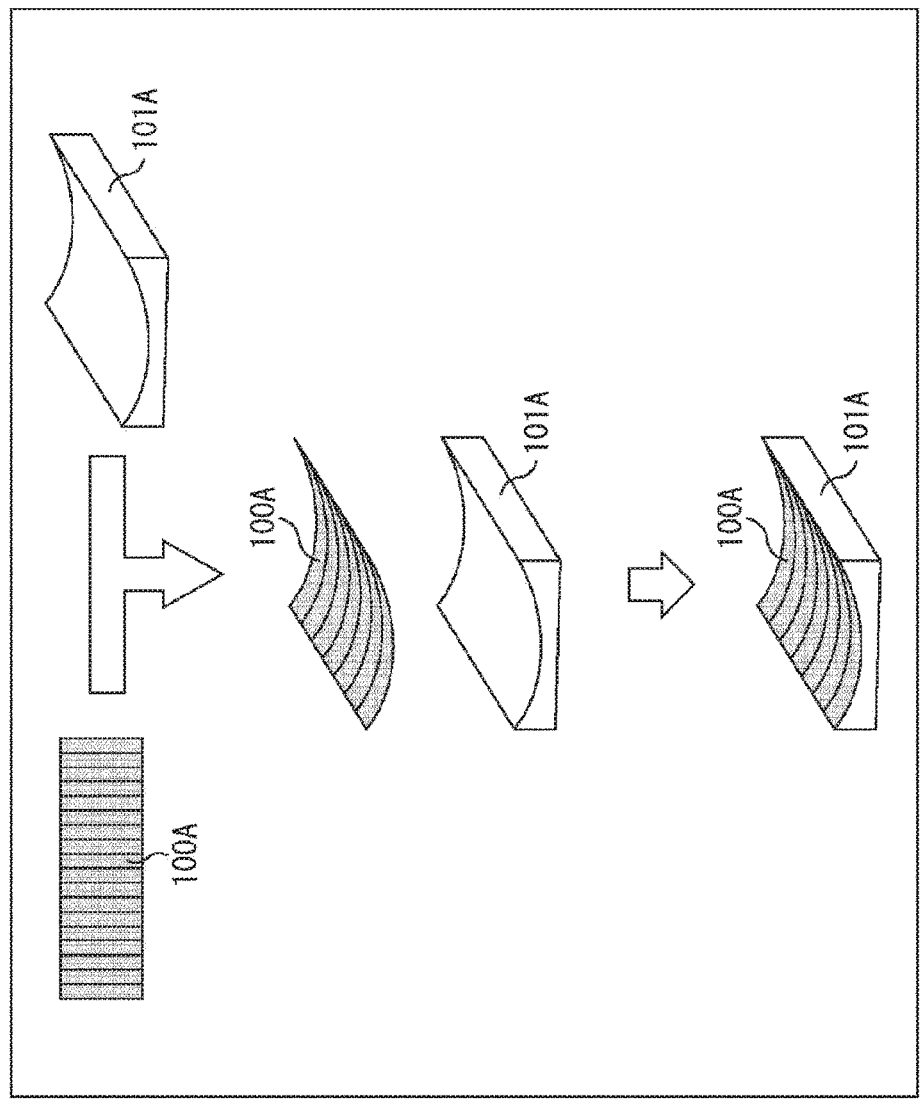
FIG. 9 is a view schematically illustrating the curved pedestal mounting process.

A detailed content of the curved pedestal mounting process corresponding to step S12 in FIG. 5 is described with reference to the flowchart in FIG. 8. Meanwhile, FIGS. 9 to 11 schematically illustrate each process of the curved pedestal mounting process in FIG. 8 and the detailed content of each process in FIG. 8 is described with reference to the drawings appropriately.

At step S31, a wafer picking up process is performed. In the wafer picking up process, the wafer 100A in the strip shape cut out in the process at step S11 in FIG. 5 is picked up.

At step S32, the die bonding process is performed. In the die bonding process, as illustrated in FIG. 9, the wafer 100A in the strip shape picked up in the process at step S31 is fixed (mounted) on the curved surface curved so as to be concave of the curved pedestal 101A.

Figure 10:
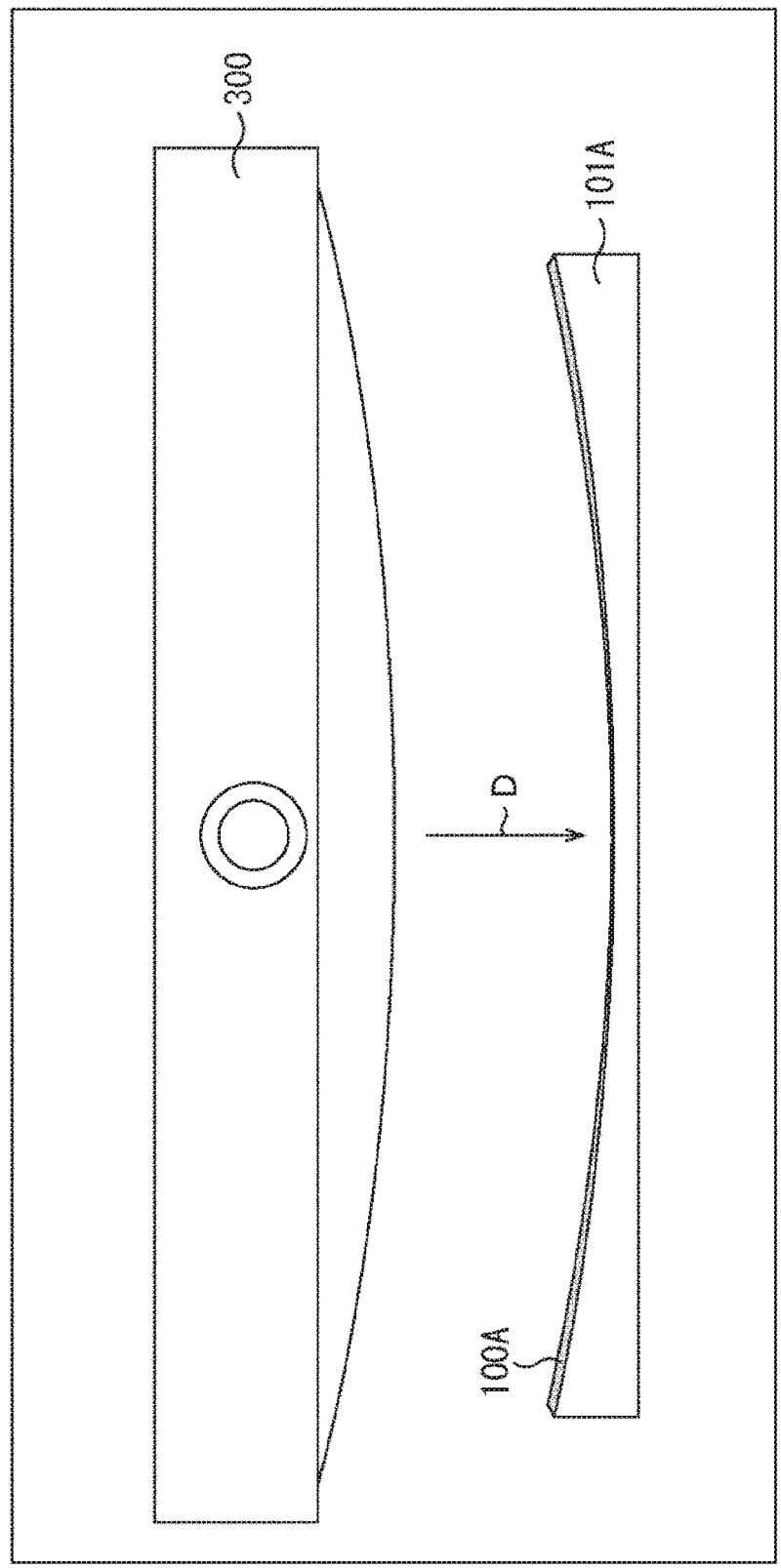
FIG. 10 is a view schematically illustrating a die bonding process.
Figure 11:
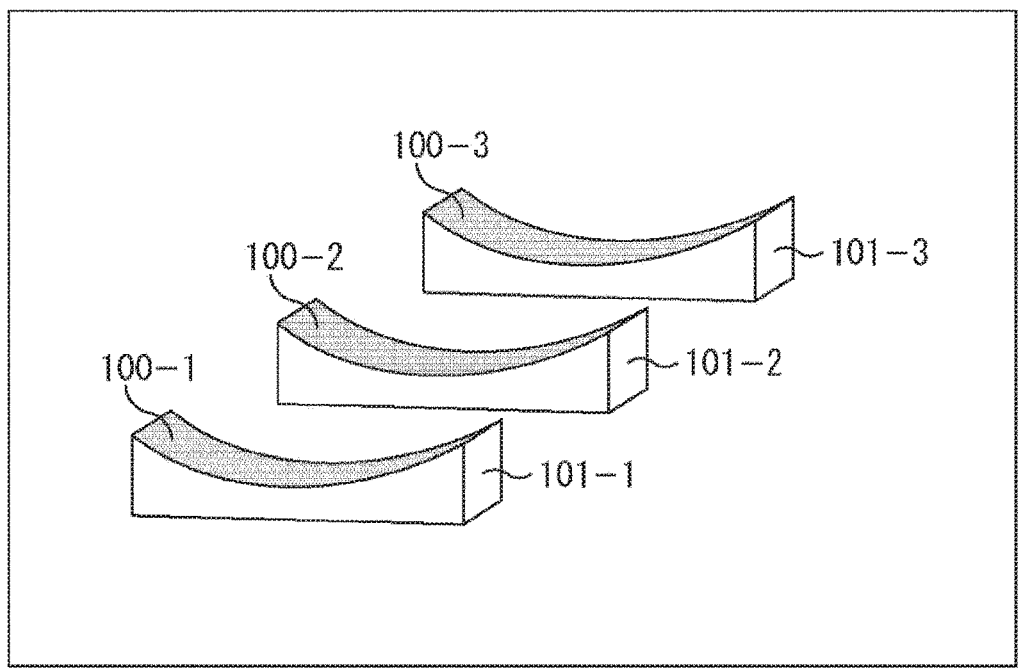
FIG. 11 is a view schematically illustrating a dicing process.

Meanwhile, regarding this mounting method, for example, as illustrated in FIG. 10, the wafer 100A in the strip shape may be fixed (bonded) to the curved surface of the curved pedestal 101A by means of a fixing agent (adhesive (die bonding material)) by pressing the wafer 100A in the strip shape put on the curved surface of the curved pedestal 101A from above (in a direction of arrow D in the drawing) by using a jig 300 having a curved surface curved so as to be convex. As the fixing agent, for example, in addition to a silicon-based or epoxy-based highly adhesive material free from heat generation and thermal history, a material which may ease or follow the heat generation and the thermal history even when they occur such as resin solder and a flexible adhesive may be used.

Herein, in a case where the linear image sensor 100 is fixed on the curved pedestal 101, a following problem might occur due to difference in thermal contraction unless the same material (for example, silicon) is used for the linear image sensor 100 and the curved pedestal 101. That is to say, there might be a first problem that the linear image sensor 100 is damaged due to the thermal history in the process of fixing the linear image sensor 100, a second problem that a designed curvature cannot be obtained after the linear image sensor 100 is fixed on the curved pedestal 101, and a third problem that the curvature changes due to the heat generation when the linear image sensor 100 operates.

This is caused by displacement and distortion between the linear image sensor 100 and the curved pedestal 101 by heat since operation of the linear image sensor 100 is always associated with the heat generation, and since work generally associated with the thermal history is required for stabilizing bonding when the linear image sensor 100 is fixed (mounted) on the curved pedestal 101.

In the embodiment of the present technology, the silicon-based or epoxy-based highly adhesive material free from the heat generation and the thermal history is used as the fixing agent for such displacement and distortion, so that even when the displacement and the distortion are to occur, they can be inhibited forcibly by bonding force, and as a result, the displacement and the distortion are not problematic even when they occur. Also, in the embodiment of the present technology, the material capable of easing or following the heat generation and the thermal history even when they occur such as the resin solder and the flexible adhesive is used as the fixing agent, so that it is possible to follow the displacement and the distortion even when they are to occur by flexibility and restoring property; and as a result, the displacement and the distortion are not problematic even when they occur.

At step S33, the dicing process is performed. In the dicing process, the curved pedestal 101A on which the wafer 100A in the strip shape is fixed in the process at step S32 is cut for each semiconductor chip (linear image sensor 100) formed on the wafer 100A in the strip shape by using a blade (not illustrated) to make a chip, as illustrated in FIG. 11.

With this arrangement, as illustrated in FIG. 11, each semiconductor chip (linear image sensor 100) formed on the wafer 100A in the strip shape is mounted on the curved surface of the curved pedestal 101. For example, in FIG. 11, a linear image sensor 100-1 is mounted on a curved surface of a curved pedestal 101-1. Also, linear image sensors 100-2 and 100-3 are mounted on curved surfaces of curved pedestals 101-2 and 101-3, respectively.

When the process at step S33 is finished, it returns to the process at step S12 in FIG. 5 and subsequent processes are performed.

The flow of the curved pedestal mounting process is described above. In the curved pedestal mounting process, the wafer picking up process (S31) to pick up the wafer 100A in the strip shape is performed, the die bonding process (S32) to fix the wafer 100A in the strip shape on the curved surface of the curved pedestal 101A is performed, and the dicing process (S33) to cut for each linear image sensor 100 formed on the wafer 100A in the strip shape to make a chip is performed.

In this manner, in the curved pedestal mounting process in FIG. 8, the wafer 100A in the strip shape on which a plurality of semiconductor chips (linear image sensors 100) is formed is fixed on the curved surface of the curved pedestal 101A and this is cut together with the curved pedestal 101A in a semiconductor chip unit to make a chip, so that mounting accuracy and improvement in yield may be realized.

That is to say, the wafer 100A in the strip shape on which a plurality of semiconductor chips (linear image sensors 100) is formed, the wafer a thickness of which is thinned is significantly easily bent (easily handled) as compared to a case where one semiconductor chip is bent alone, so that the wafer 100A in the strip shape may be easily fixed (mounted) on the curved surface of the curved pedestal 101A, and it is possible to improve the mounting accuracy and yield thereof. Furthermore, the linear image sensor 100 is such that a bonding surface thereof has a size to cover an entire curved surface of the curved pedestal 101A or a large part thereof, so that this is advantageously easily fixed (mounted) on the curved pedestal 101.

<3. Configuration of Semiconductor Module>

Application of the present technology is not limited to that to the semiconductor package. That is to say, the present technology is applicable to general electronic devices including the semiconductor package such as the semiconductor module including the optical lens system and the like, for example, the image reading device such as the copying machine, the image scanner, the bar code reader, and the multifunction printer in addition to the semiconductor package.

Figure 12:
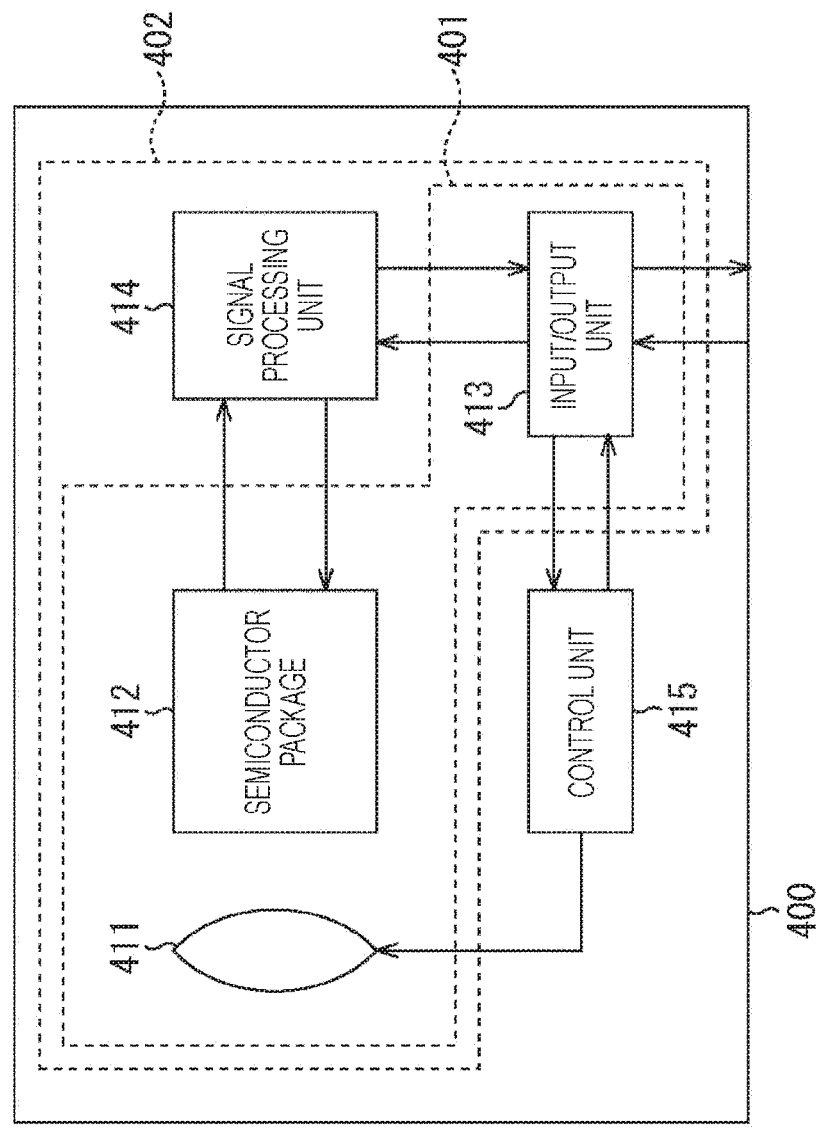
FIG. 12 is a view illustrating a configuration example of a semiconductor module including the semiconductor package to which the present technology is applied.

FIG. 12 is a view illustrating a configuration example of the semiconductor module including the semiconductor package.

In FIG. 12, a semiconductor module 400 incorporates an optical lens system 411, a semiconductor package 412, an input/output unit 413, a signal processing unit 414, and a control unit 415 to form a module.

The semiconductor package 412 corresponds to the semiconductor package 10 in FIG. 1 and a cross-sectional structure in FIG. 2 is adopted, for example, as the structure thereof. That is to say, in the semiconductor package 412, the linear image sensor 100 is fixed (mounted) on the curved surface of the curved pedestal 101, and the light-receiving area formed of a plurality of pixels is curved so as to be concave to the light incident side.

The input/output unit 413 has a function as an input/output interface with outside. The signal processing unit 414 is a signal processing circuit which processes signals output from the semiconductor package 412. The control unit 415 controls the optical lens system. 411 and communicates data with the input/output unit 413.

Meanwhile, the configuration of the semiconductor module is not limited to that of the semiconductor module 400, and this may also be configured as semiconductor modules 401 and 402 indicated by dotted line in the drawing.

Specifically, the module may be formed only of the optical lens system 411, the semiconductor package 412, and the input/output unit 413, for example, as the semiconductor module 401. In this case, a signal from the semiconductor package 412 is output through the input/output unit 413.

Also, the module may be formed of the optical lens system 411, the semiconductor package 412, the input/output unit 413, and the signal processing unit 414 as the semiconductor module 402. In this case, the signal from the semiconductor package 412 is processed by the signal processing unit 414 to be output through the input/output unit 413.

The semiconductor modules 400, 401, and 402 are formed in the above-described manner. In the semiconductor modules 400, 401, and 402, the semiconductor package 412 including the linear image sensor 100 and the curved pedestal 101 is provided, and in the semiconductor package 412, the optical characteristic and chromatic aberration may be more certainly improved.

<4. Configuration of Image Reading Device>

Figure 13:
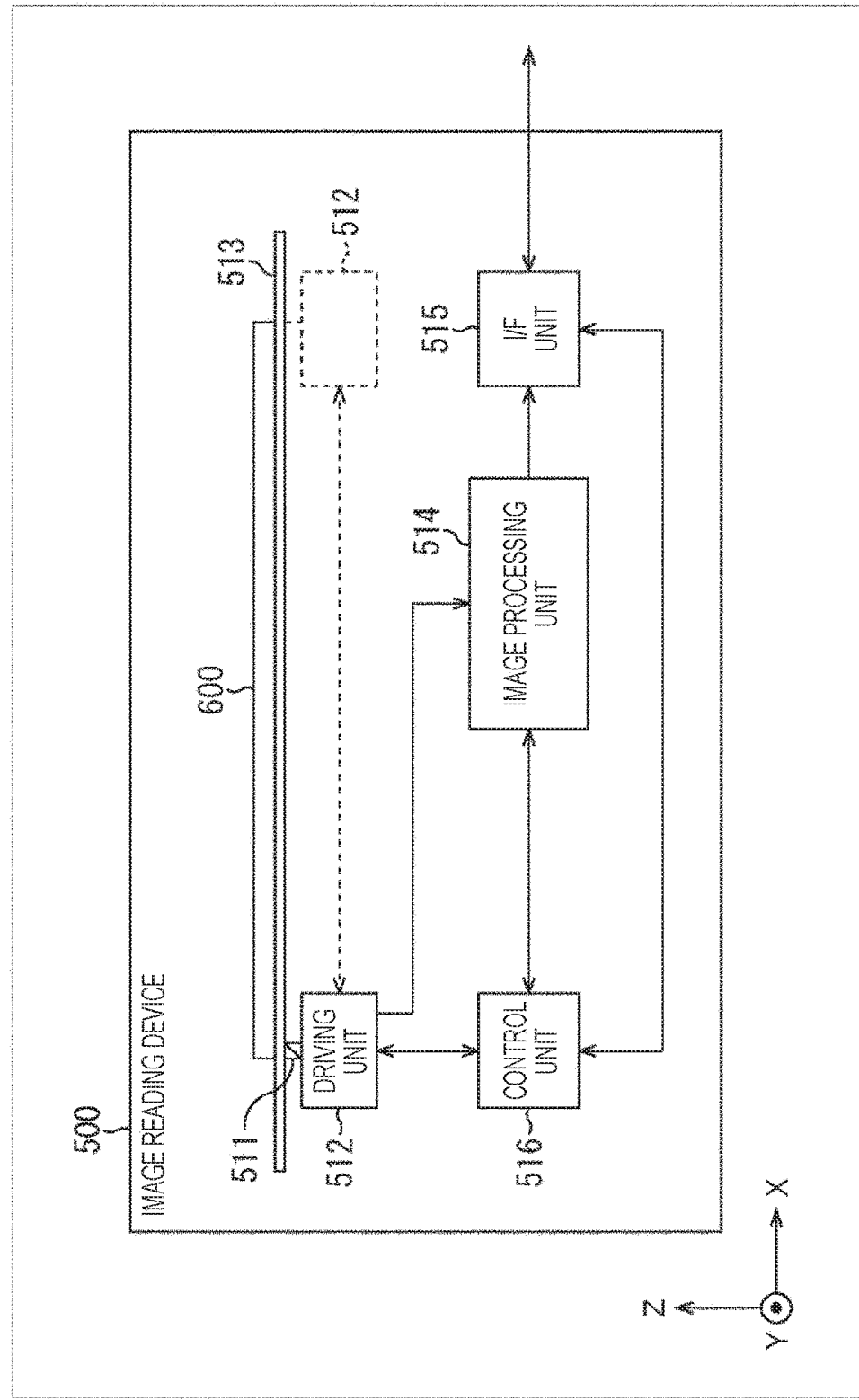
FIG. 13 is a view illustrating a configuration example of an image reading device including the semiconductor package to which the present technology is applied.

FIG. 13 is a view illustrating a configuration example of the image reading device including the semiconductor module.

An image reading device 500 is an electronic device such as an image scanner, for example. In FIG. 13, the image reading device 500 is formed of a semiconductor module 511, a driving unit 512, a glass platen 513, an image processing unit 514, an I/F unit 515, and a control unit 516.

Meanwhile, the semiconductor module 511 corresponds to the semiconductor module 400 in FIG. 12 and the like. In addition, although not illustrated, the image reading device 500 is provided with an automatic paper feeding mechanism which continuously arranges an original 600 on the glass platen 513 in which the original 600 an image on which is to be read is set.

In the image reading device 500, in a case where the control unit 516 is notified of a request from an external device (for example, a personal computer and the like) through the I/F unit 515, this controls the automatic paper feeding mechanism to put the original 600 on the glass platen 513 being a platen and starts reading operation of the original 600.

Then, the control unit 516 controls the driving unit 512 for driving the semiconductor module 511 to move the semiconductor module 511 in an X direction being a sub-scanning direction. With this arrangement, image signals of a line in a Y-direction (horizontal line) being a main-scanning direction are output from the semiconductor module 511. The image signals output from the semiconductor module 511 are sequentially input to the image processing unit 514.

The image processing unit 514 generates image data on the basis of the image signals in the horizontal direction input from the semiconductor module 511. The image data generated by the image processing unit 514 is output to the external device through the I/F unit 515.

Meanwhile, the image signals of each horizontal line output from the semiconductor module 511 is a time-series electrical signal of the one-dimensional image information, one line of continuous pixel signals being voltage signals according to signal charges of the photoelectric conversion elements (photodiodes) of the semiconductor package (semiconductor package 10) included in the semiconductor module 511.

Then, the semiconductor module 511 is driven by the driving unit 512 to sequentially move in the sub-scanning direction (X direction) to repeat operation of storing, transferring, and outputting the signal charges for each horizontal line, thereby obtaining the image information of an entire original 600.

The image reading device 500 is configured in the above-described manner. The image reading device 500 is provided with (the semiconductor module 511 provided with) the semiconductor package including the linear image sensor 100 and the curved pedestal 101, and the semiconductor package may more certainly improve the optical characteristic and the chromatic aberration.

Meanwhile, the embodiment of the present technology is not limited to the above-described embodiment and various modifications may be made without departing from the scope of the present technology. For example, it is possible to adopt a combination of all or some of a plurality of embodiments described above.

The present technology may also have the following configurations.

(1)
A semiconductor device including:
a pedestal having a cylindrical shape including a curved surface curved so as to be concave to a light incident side; and
a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

(2)
The semiconductor device according to (1), in which respective pixels on the light-receiving area are at the same distance from a center of a lens which allows light from an object to be incident on the light-receiving area.

(3)
The semiconductor device according to (1) or (2), in which
the linear image sensor is fixed on the curved surface of the pedestal with a highly adhesive material free from heat generation or thermal history or with a material capable of easing or following the heat generation or the thermal history even when the heat generation or the thermal history occurs.

(4)
The semiconductor device according to (3), in which
the highly adhesive material free from the heat generation or the thermal history is a silicon-based or epoxy-based material, and
the material capable of easing or following the heat generation or the thermal history even when the heat generation or the thermal history occurs is resin solder or a flexible adhesive.

(5)
The semiconductor device according to any one of (1) to (4), in which
the linear image sensor is fixed so as to cover an entire curved surface or a large part of the curved surface.

(6)
The semiconductor device according to any one of (1) to (5), in which
a thickness of the linear image sensor is thinned.

(7)
A method of manufacturing a semiconductor device including:
a process of cutting out a wafer in a strip shape on which a plurality of linear image sensors on which a plurality of pixels each including a photoelectric conversion element is arranged in a one-dimensional direction is formed from a wafer on which a circuit is formed;
a process of fixing the wafer in the strip shape on a pedestal having a cylindrical shape including a curved surface curved so as to be concave to a light incident side; and
a process of cutting out the pedestal on which the wafer in the strip shape is fixed for each linear image sensor to make a chip.

(8)
The method of manufacturing the semiconductor device according to (7), in which
a thickness of the wafer in the strip shape is thinned.

(9)
A semiconductor module including: a semiconductor device; an optical lens system; and a signal processing unit, in which
the semiconductor device includes
a pedestal having a cylindrical shape including a curved surface curved so as to be concave to a light incident side, and
a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

(10)
An electronic device including:
a semiconductor device including
a pedestal having a cylindrical shape including a curved surface curved so as to be concave to a light incident side, and
a linear image sensor on which a plurality of pixels each including a photoelectric conversion element is arranged in a one-dimensional direction, the linear image sensor fixed on the curved surface on which a light-receiving area formed of the plurality of pixels is curved so as to be concave to the light incident side.

REFERENCE SIGNS LIST

10 Semiconductor package
100 Linear image sensor
100A Wafer in strip shape
101, 101A Curved pedestal
102, 102A, 102B Wire
103 Substrate
103A, 103B Planar substrate
104A, 104B Frame portion
105 Glass
106, 106A, 106B Terminal
111 Lens
200 Wafer
300 Jig
400, 401, 402 Semiconductor module
411 Optical lens system
412 Semiconductor package
500 Image reading device
511 Semiconductor module

The invention claimed is:

1. A semiconductor device, comprising:
a pedestal having a cylindrical shape, wherein the pedestal includes a curved surface curved so as to be concave to a light incident side of the semiconductor device; and
a linear image sensor comprising a plurality of pixels arranged in a one-dimensional direction,
wherein each pixel of the plurality of pixels includes a photoelectric conversion element,
wherein the linear image sensor is fixed on the curved surface,
wherein a light-receiving area formed of the plurality of pixels is curved so as to be concave to the light incident side, and
wherein a curvature of the curved surface is such that each pixel of the plurality of pixels on the light-receiving area is at a same distance from a center of a lens which allows light from an object to be incident on the light-receiving area.

2. The semiconductor device according to claim 1, wherein the linear image sensor is fixed on the curved surface of the pedestal with one of an adhesive material free from heat generation or thermal history or a material configured to ease or follow the heat generation or the thermal history based on occurrence of the heat generation or the thermal history.

3. The semiconductor device according to claim 2, wherein the adhesive material free from the heat generation or the thermal history is one of a silicon-based material or an epoxy-based material, and the material configured to ease or follow the heat generation or the thermal history based on the occurrence of the heat generation or the thermal history is one of a resin solder or a flexible adhesive.

4. The semiconductor device according to claim 1, wherein the linear image sensor covers an entire surface of the curved surface.

5. The semiconductor device according to claim 1, wherein a thickness of the linear image sensor is thinned.

6. A method of manufacturing a semiconductor device, comprising:
cutting out a wafer in a strip shape from a wafer on which a circuit is formed,
wherein a plurality of linear image sensors are arranged in a one-dimensional direction on the wafer in the strip shape,
wherein each linear image sensor of the plurality of linear image sensors comprises a plurality of pixels arranged in a one-dimensional direction,
wherein each pixel of the plurality of pixels includes a photoelectric conversion element, and
wherein a light-receiving area formed of the plurality of pixels is curved so as to be concave to a light incident side of the semiconductor device;
fixing the wafer in the strip shape on a pedestal having a cylindrical shape, wherein the pedestal includes a curved surface curved so as to be concave to the light incident side,
wherein a curvature of the curved surface is such that each pixel of the plurality of pixels on the light-receiving area is at a same distance from a center of a lens which allows light from an object to be incident on the light-receiving area; and
cutting out the pedestal on which the wafer in the strip shape is fixed for each linear image sensor of the plurality of linear image sensors to make a chip.

7. The method of manufacturing the semiconductor device according to claim 6, wherein a thickness of the wafer in the strip shape is thinned.

8. A semiconductor module, comprising:
a semiconductor device;
an optical lens system comprising a lens configured to allow light from an object to be incident on a light-receiving area of the semiconductor device; and
a signal processing unit configured to process a signal output from the semiconductor device, wherein
the semiconductor device includes:
a pedestal having a cylindrical shape, wherein the pedestal includes a curved surface curved so as to be concave to a light incident side of the semiconductor device; and
a linear image sensor comprising a plurality of pixels arranged in a one-dimensional direction,
wherein each pixel of the plurality of pixels includes a photoelectric conversion element,
wherein the linear image sensor is fixed on the curved surface,
wherein the light-receiving area formed of the plurality of pixels is curved so as to be concave to the light incident side, and
wherein a curvature of the curved surface is such that each pixel of the plurality of pixels on the light-receiving area is at a same distance from a center of the lens.

9. An electronic device, comprising:
a semiconductor device including:
a pedestal having a cylindrical shape, wherein the pedestal includes a curved surface curved so as to be concave to a light incident side of the semiconductor device; and
a linear image sensor comprising a plurality of pixels arranged in a one-dimensional direction,
wherein each pixel of the plurality of pixels includes a photoelectric conversion element,
wherein the linear image sensor is fixed on the curved surface,
wherein a light-receiving area formed of the plurality of pixels is curved so as to be concave to the light incident side, and
wherein a curvature of the curved surface is such that each pixel of the plurality of pixels on the light-receiving area is at a same distance from a center of a lens which allows light from an object to be incident on the light-receiving area.

* * * * *